(12) United States Patent
Wong

(10) Patent No.: US 7,118,387 B2
(45) Date of Patent: Oct. 10, 2006

(54) SOCKET

(76) Inventor: Windy Wong, 81 West Lakepoint, Clifford Estate, Zhongcun Town, Panyu District, Guangzhou City, Gungdong Province (CN)

( * ) Notice: Subject to any disclaimer, the term of this patent is extended or adjusted under 35 U.S.C. 154(b) by 0 days.

(21) Appl. No.: 11/214,824

(22) Filed: Aug. 31, 2005

(65) Prior Publication Data

US 2006/0044770 A1    Mar. 2, 2006

(30) Foreign Application Priority Data

Aug. 31, 2004   (CN) .................. 2004 2 0083457

(51) Int. Cl.
*H01R 12/00* (2006.01)
(52) U.S. Cl. ..................... 439/73; 439/331; 439/71
(58) Field of Classification Search ................ 257/678; 439/70, 700, 331, 73, 71; 361/820
See application file for complete search history.

(56) References Cited

U.S. PATENT DOCUMENTS

| 6,908,327 | B1 * | 6/2005 | Ma ............................. 439/331 |
| 2004/0087200 | A1 * | 5/2004 | Tan ............................. 439/342 |
| 2005/0095906 | A1 * | 5/2005 | He et al. .................... 439/526 |

* cited by examiner

*Primary Examiner*—Leonard Andujar
*Assistant Examiner*—Krista Soderholm
(74) *Attorney, Agent, or Firm*—Rosenberg, Klein & Lee

(57) ABSTRACT

A socket is adapted for electrically connecting a chip module and a printed circuit board, and the socket includes a main body having a base and a plurality of contacts arranged in the base for resiliently contacting with the chip module, wherein the base includes a foundation and two lateral sidewalls extending from the foundation; an upper lid movably connecting to the main body; and a lock member securing the upper lid and the main body together. Each of the two lateral sidewalls has a projection disposed on at least one corner of an upper surface thereof for abutting against the upper lid.

9 Claims, 3 Drawing Sheets

SOCKET

BACKGROUND OF THE INVENTION

1. Field of the Invention

The present invention relates to a socket, and more particularly to a socket adapted for connecting a chip module to a printed circuit board.

2. Background of the Invention

A conventional socket is generally used for connecting a chip module and a printed circuit board for electrical connection. The conventional socket, shown in FIGS. 1 to 3, includes an upper lid 1 and a lower lid 2 movably connected to each other, and further includes a base 3 received in the lower lid 2 for supporting a chip module (not shown) and a lever 4 pivoted to the upper lid 1 for securing the upper and lower lids 1 and 2, wherein the base 3 has a plurality of contacts (not shown) for electrically connecting the chip module.

When the chip module is disposed in the base 3, the upper lid 1 is covered, and the lever 4 is suppressed, the chip module can electrically connect to the socket. However, a bottom of the lower lid 1 will warp upwardly due to the unbalanced nature of the force acting upon it, so as to prevent the base 3a from being deformed. Therefore, the chip module will not connect to the socket very well.

SUMMARY OF INVENTION

A socket is provided to electrically connect firmly and securely to a chip module.

A socket is adapted for electrically connecting a chip module and a printed circuit board. The socket includes a main body having a base and a plurality of contacts arranged in the base for resiliently contacting the chip module, wherein the base includes: a foundation and two lateral sidewalls extending from the foundation; an upper lid connecting the main body movably; and a lock member securing the upper lid and the main body. Each of the two lateral sidewalls has a projection disposed on at least one corner of an upper surface thereof for abutting against the upper lid.

To provide a further understanding of the invention, the following detailed description illustrates embodiments and examples of the invention. Examples of the more important features of the invention have thus been summarized rather broadly in order that the detailed description thereof that follows may be better understood, and in order that the contributions to the art may be appreciated. There are, of course, additional features of the invention that will be described hereinafter which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

Figure 1:
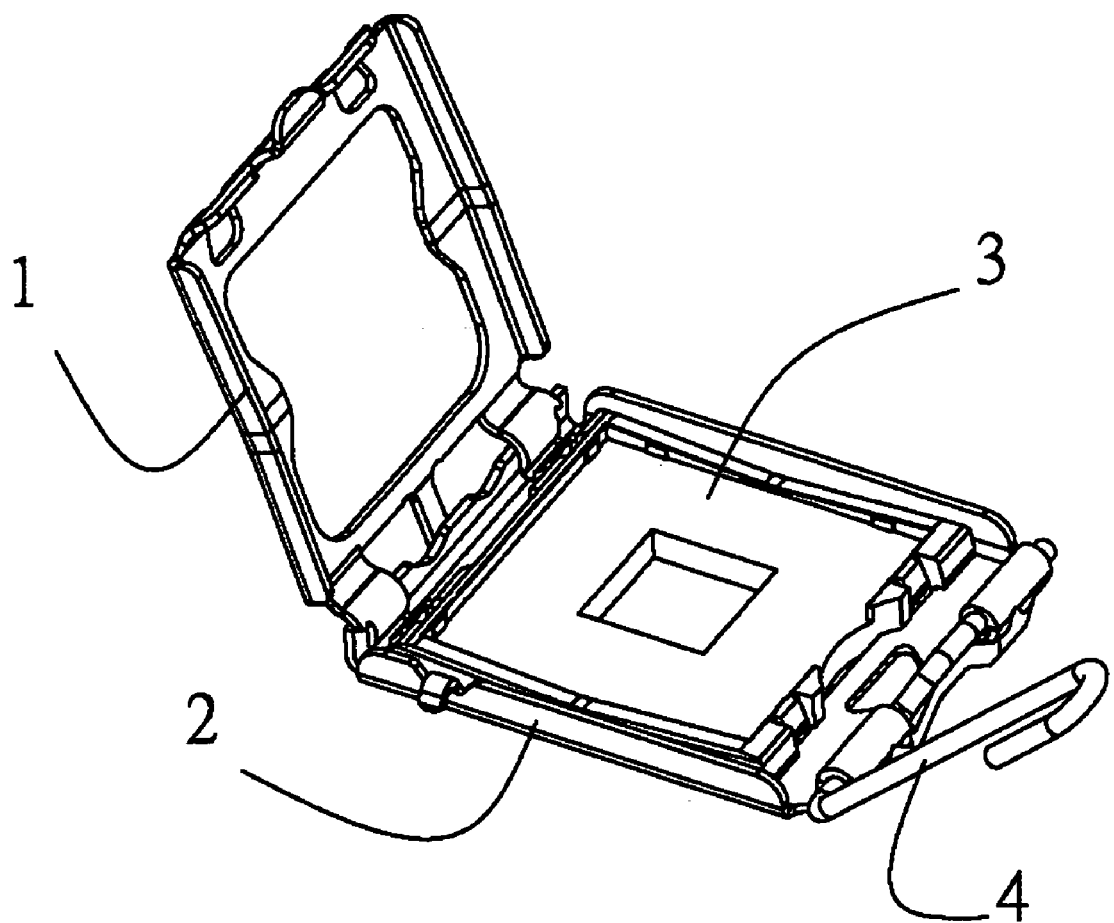
FIG. 1 is a perspective view of a conventional socket.
Figure 2:
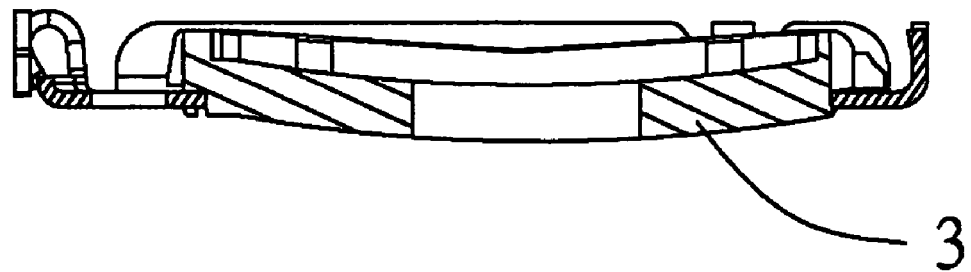
FIG. 2 is a side view of the conventional socket after it has been assembled with a chip module.
Figure 3:
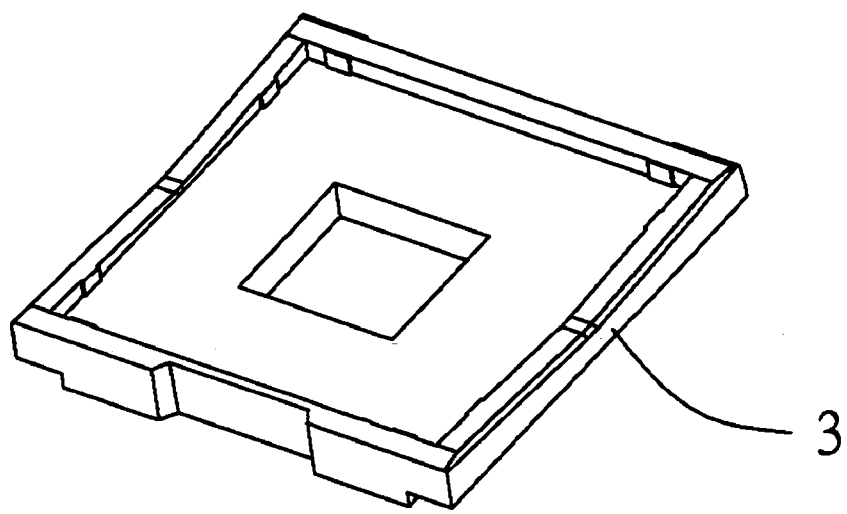
FIG. 3 is a perspective view of a base of the conventional socket.
Figure 4:
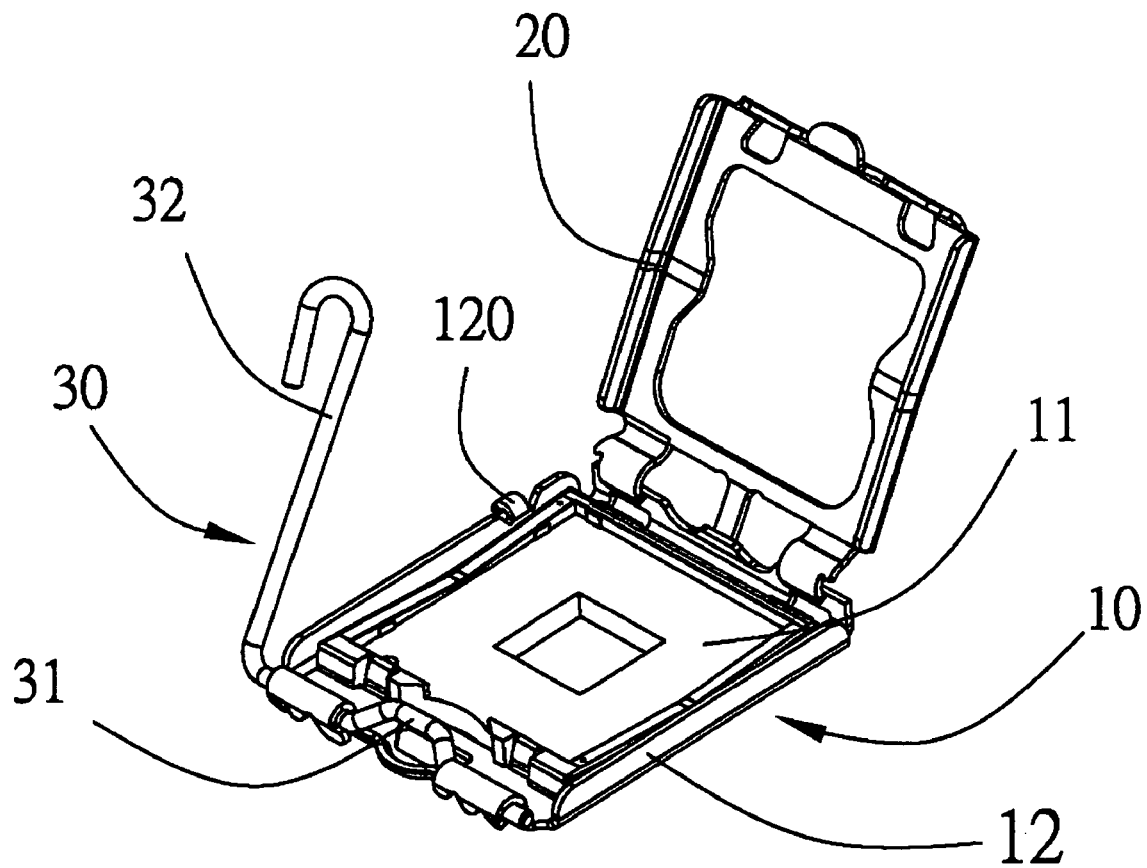
FIG. 4 is a perspective view of a socket according to the present invention.
Figure 5:
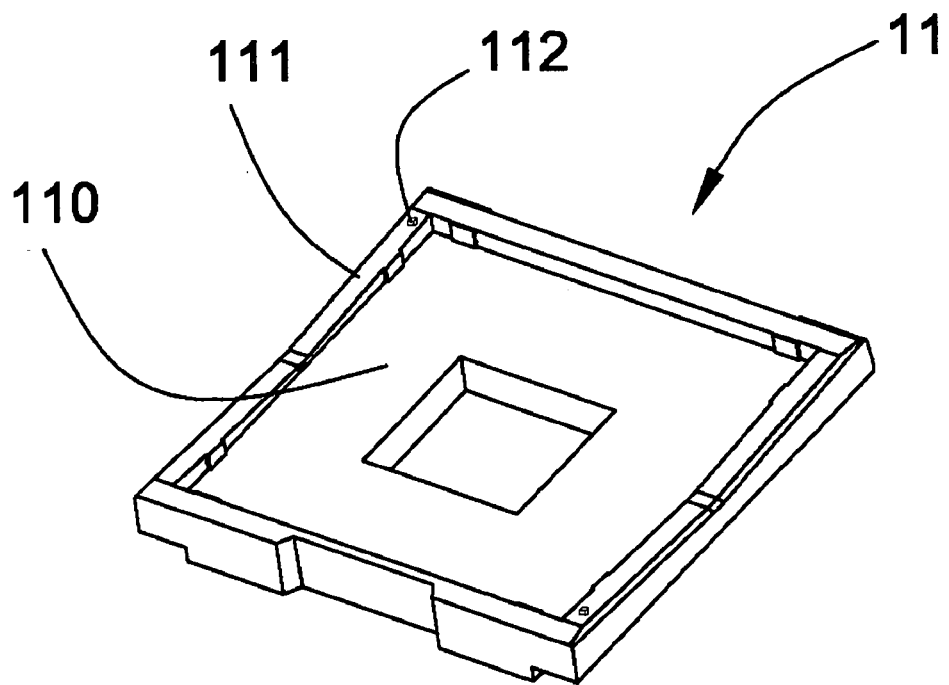
FIG. 5 is a perspective view of a base of the socket according to the present invention.
Figure 6:
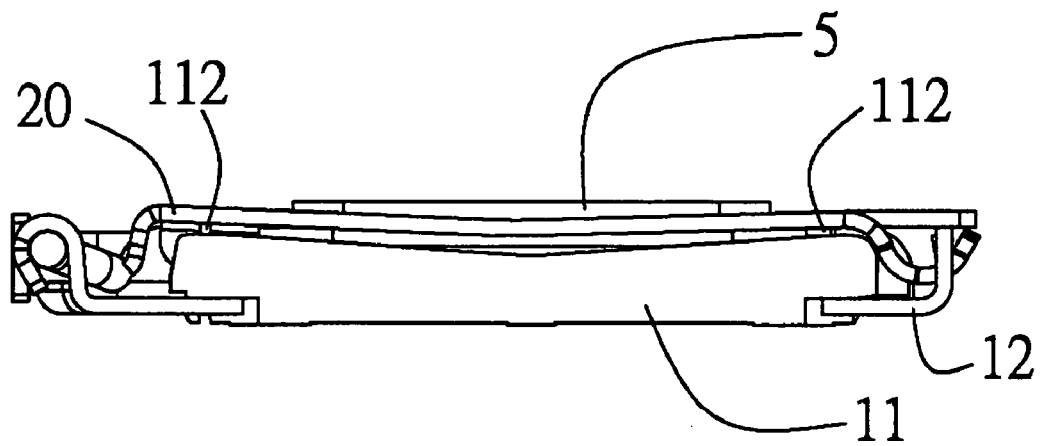
FIG. 6 is a side view of the socket after it has been assembled with a chip module.

With respect to FIGS. 4 to 6, a socket according to the present invention is provided for electrically connecting a chip module 5 to a printed circuit board (not shown). The socket includes a main body 10, an upper lid 20 connecting with the main body 10 movably, and a lever 30 secured to the main body 10 by the upper lid 20.

The main body 10 includes a base 11, which has a plurality of contacts (not shown) arranged therein for resiliently connecting with the chip module 5, and a lower lid 12 containing the base 11 for supporting the chip module 5. The lower lid 12 has a protrusion 120 arranged at a side thereof and adjacent to an end thereof in an outward manner. The base 11 includes a foundation 110 and four lateral sidewalls 111 extending upwardly from a periphery of the foundation 110. Each of two opposite lateral sides 111 includes a projection 112 formed on an upper surface thereof. The two projections 112 are arranged in a diagonal manner. One of the two projections 112 corresponds to the protrusion 120 of the lower lid 12.

The upper lid 2 is pivoted to the lower lid 10 and suppresses the chip module 5 to the base 11 via an end arranged with the protrusion 120. The lever 30 pivots to an opposite end of the lower lid 12, and includes a pivot portion 31 and an operation portion 32. The pivot portion 31 pivots to the lower lid 12. The operation portion 32 extends from an end of the pivot portion 31 vertically. The operation portion 32 has a free end that can be latched to the protrusion 120.

After the steps of arranging the chip module 5 on the base 11, the upper lid 20 can be pressed and fastened by the lever 30 to the protrusion 120 of the lower lid 12, the lower lid 12 will warp upwardly due to an upward force and the base 11 received in the lower lid 12 will also warp upwardly. However, the projections 112 of the lateral sidewalls 111 of the base 11 will abut against a lower surface of the upper lid 20, thereby preventing the base 11 from warping upwardly and ensuring an excellent electrical connection between the socket and the chip module 5.

Actually, the lower lid 12 can be omitted in the present invention. Instead the base can include another protrusion formed at a side and adjacent to an end thereof outwardly. The lever 30 includes a pivot portion pivoted to an end of the base 31 and an operation portion 32 extending vertically from the pivot portion. The operation portion has a free end latched with the protrusion. The projections can be arranged at a position corresponding to the protrusion and at another position diagonal to the first one and arranged on an opposite corner. In addition, the lock member is not limited by the lever. A screw or another device can be provided for securing the upper lid and the main body together.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A socket adapted for an electrical connection between a chip module and a printed circuit board, comprising:

a main body having a base and a plurality of contacts arranged on the base for resiliently contacting the chip module, wherein the base includes a foundation having two lateral sidewalls extending upwardly from a periphery of the foundation;

an upper lid movably connected to the main body; and a lock member adapted for securing the upper lid and the main body;

wherein the foundation further includes two projections disposed diagonally, a first of the two projections being arranged on a front end of an upper surface of a respective one of the lateral sidewalls, and a second of said projections being arranged on a rear end of an upper surface of the other lateral sidewall so that the two projections abut against the upper lid.

2. The socket as claimed in claim 1, wherein the main body includes a lower lid containing the base, and the upper lid and the lock member connect with the lower lid.

3. The socket as claimed in claim 2, wherein the lower lid includes an outwardly extending protrusion adjacent to a rear-end edge thereof, the lock member being a lever having a pivot portion pivoted to an end of the lower lid and an operation portion vertically extending from the pivot portion, wherein the operation portion has a free end latched to the protrusion.

4. The socket as claimed in claim 1, wherein the base includes an outwardly extending protrusion formed adjacent to a rear-end edge thereof, the lock member is a lever having a pivot portion pivoted to an end of the base and an operation portion vertically extending from the pivot portion, wherein the operation portion has a free end latched to the protrusion being diagonal to the first projection of the foundation.

5. A socket adapted for an electrical connection between a chip module and a printed circuit board, and comprising:

a main body having a base and a plurality of contacts arranged on the base for resiliently touching the chip module, wherein the base includes a foundation, two lateral sidewalls extending upwards from a peripheral of the foundation, and a cavity defined by the foundation and the two lateral sidewalls for receiving the chip module;

an upper lid connecting the main body movably; and a lock member being capable of securing the upper lid and the main body;

wherein the foundation further includes at least two projections disposed diagonally; a first one is arranged on a front end of an upper surface of a respective one of the lateral sidewalls, and a second one is arranged on a rear end of an upper surface of the other lateral sidewall, so that the two projections abut against the upper lid while the chip module is received inside the cavity.

6. The socket as claimed in claim 5, wherein the two projections are adjacent to an edge of the respective lateral sidewall.

7. The socket as claimed in claim 5, wherein the main body includes a lower lid containing the base, and the upper lid and the lock member connect with the lower lid.

8. The socket as claimed in claim 7, wherein the lower lid includes a protrusion adjacent to a rear-end edge thereof and extending outwards; wherein the lock member is a lever, which has a pivot portion pivoted to an end of the lower lid and an operation portion vertically extending from the pivot portion, wherein the operation portion has a free end latched to the protrusion being adjacent to the first projection.

9. The socket as claimed in claim 5, wherein the base includes a protrusion adjacent to a rear-end edge thereof and extending outwards; wherein the lock member is a lever, which has a pivot portion pivoted to an end of the lower lid and an operation portion vertically extending from the pivot portion, wherein the operation portion has a free end latched to the protrusion being adjacent to the first projection.

* * * * *